(12) United States Patent
Desai et al.

(10) Patent No.: US 9,052,445 B2
(45) Date of Patent: Jun. 9, 2015

(54) MOLDED GLASS LID FOR WAFER LEVEL PACKAGING OF OPTO-ELECTRONIC ASSEMBLIES

(71) Applicant: Cisco Technology, Inc., San Jose, CA (US)

(72) Inventors: Kishor Desai, Fremont, CA (US); Ravinder Kachru, Los Altos Hills, CA (US); Vipulkumar Patel, Breinigsville, PA (US); Bipin Dama, Bridgewater, NJ (US); Kalpendu Shastri, Orefield, PA (US); Soham Pathak, Allentown, PA (US)

(73) Assignee: CISCO Technology, Inc., San Jose, CA (US)

( * ) Notice: Subject to any disclaimer, the term of this patent is extended or adjusted under 35 U.S.C. 154(b) by 0 days.

(21) Appl. No.: 13/656,528

(22) Filed: Oct. 19, 2012

(65) Prior Publication Data
US 2013/0101250 A1    Apr. 25, 2013

Related U.S. Application Data

(60) Provisional application No. 61/548,974, filed on Oct. 19, 2011.

(51) Int. Cl.
*H01L 21/00*    (2006.01)
*G02B 6/12*    (2006.01)
(Continued)

(52) U.S. Cl.
CPC ........ *G02B 6/12* (2013.01); *H01L 33/52* (2013.01); *H05K 1/0274* (2013.01);
(Continued)

(58) Field of Classification Search
CPC ....................................................... H01L 33/52
USPC .......................................................... 438/26
See application file for complete search history.

(56) References Cited

U.S. PATENT DOCUMENTS 4,558,171 A    12/1985    Gantley et al.
5,023,447 A *    6/1991    Masuko et al. .......... 250/227.24
(Continued)

FOREIGN PATENT DOCUMENTS

DE    10147648 A1 *    4/2003
EP    1 109 041    6/2001
WO    WO 96/00920    1/1996

OTHER PUBLICATIONS

'GP-10000HT SPIE PW11 Presentation', 2011, pp. 1-10; dyna technologies'.*
(Continued)

*Primary Examiner* — Jarrett Stark
*Assistant Examiner* — Mohammad M Hoque
(74) *Attorney, Agent, or Firm* — Patterson & Sheridan LLP

(57) ABSTRACT

An opto-electronic assembly is provided comprising a substrate (generally of silicon or glass) for supporting a plurality of interconnected optical and electrical components. A layer of sealing material is disposed to outline a defined peripheral area of the substrate. A molded glass lid is disposed over and bonded to the substrate, where the molded glass lid is configured to create a footprint that matches the defined peripheral area of the substrate. The bottom surface of the molded glass lid includes a layer of bonding material that contacts the substrate's layer of sealing material upon contact, creating a bonded assembly. In one form, a wafer level assembly process is proposed where multiple opto-electronic assemblies are disposed on a silicon wafer and multiple glass lids are molded in a single sheet of glass that is thereafter bonded to the silicon wafer.

13 Claims, 3 Drawing Sheets

(51) Int. Cl.

| | | |
|---|---|---|
| *H01L 33/52* | (2010.01) | |
| *G02B 6/42* | (2006.01) | |
| *G02B 6/43* | (2006.01) | |
| *H01L 23/04* | (2006.01) | |
| *H01L 23/48* | (2006.01) | |
| *H01L 25/16* | (2006.01) | |
| *H01L 31/0203* | (2014.01) | |
| *H05K 1/02* | (2006.01) | |
| *H01L 21/50* | (2006.01) | |

(52) U.S. Cl.
CPC ............. *H01L 2924/1616* (2013.01); *H01L 2924/16788* (2013.01); *H01L 2924/165* (2013.01); *H01L 21/50* (2013.01); *H01L 2924/15311* (2013.01); *H01L 2924/16152* (2013.01); *H05K 2201/10121* (2013.01); *G02B 6/4255* (2013.01); *G02B 6/4292* (2013.01); *G02B 6/4201* (2013.01); *G02B 6/43* (2013.01); *H01L 23/04* (2013.01); *H01L 23/48* (2013.01); *H01L 25/167* (2013.01); *H01L 31/0203* (2013.01); *H05K 1/0268* (2013.01)

(56) References Cited

U.S. PATENT DOCUMENTS

| | | | | |
|---|---|---|---|---|
| 5,024,883 | A * | 6/1991 | SinghDeo et al. | 428/323 |
| 6,555,904 | B1 | 4/2003 | Karpman | |
| 6,660,564 | B2 | 12/2003 | Brady | |
| 7,388,285 | B2 | 6/2008 | Heschel et al. | |
| 7,681,306 | B2 | 3/2010 | Heschel et al. | |
| 7,888,758 | B2 | 2/2011 | Lake | |
| 2005/0063649 | A1* | 3/2005 | Fukuda et al. | 385/92 |
| 2005/0111797 | A1 | 5/2005 | Sherrer et al. | |
| 2005/0241135 | A1* | 11/2005 | Heschel et al. | 29/592 |
| 2006/0113906 | A1* | 6/2006 | Ogawa | 313/512 |
| 2007/0190747 | A1* | 8/2007 | Humpston et al. | 438/460 |
| 2008/0029879 | A1* | 2/2008 | Tuckerman et al. | 257/704 |
| 2009/0014055 | A1* | 1/2009 | Beck et al. | 136/246 |
| 2009/0217516 | A1* | 9/2009 | Pawlowski et al. | 29/832 |
| 2009/0321867 | A1* | 12/2009 | Leib et al. | 257/434 |
| 2010/0142886 | A1 | 6/2010 | Warashina et al. | |
| 2011/0249534 | A1* | 10/2011 | Fukuda et al. | 368/47 |
| 2012/0199920 | A1 | 8/2012 | Zhang et al. | |
| 2013/0209751 | A1* | 8/2013 | Zhang et al. | 428/174 |

OTHER PUBLICATIONS

Gilleo, et al., "Injection Molded & Micro Fabrication Electronic Packaging", Molding 2005, pp. 1-14.

Chung, et al., "New Approach to Low Cost Cavity Packaging", pp. 1-8.

Gilleo, et al., "Low Ball BGA: A New Concept in Thermoplastic Packaging", SemiConWest04, pp. 1-11.

* cited by examiner (a)

(b)

(c)

MOLDED GLASS LID FOR WAFER LEVEL PACKAGING OF OPTO-ELECTRONIC ASSEMBLIES

CROSS-REFERENCE TO RELATED APPLICATIONS

This application claims the benefit of U.S. Provisional Application No. 61/548,974 filed Oct. 19, 2011 and herein incorporated by reference.

TECHNICAL FIELD

The present disclosure relates generally to wafer level packaging of opto-electronic assemblies, particularly to the utilization of a molded glass lid in the fabrication process.

BACKGROUND

Many types of opto-electronic modules comprise a number of separate optical and electrical components that require precise placement relative to one another. A silicon (or glass) carrier substrate (sometimes referred to as an interposer) is generally used as a support structure to fix the location of the components and may, at times, also provide the desired electrical or optical signal paths between selected components. As the components are being assembled on the interposer, active optical alignment may be required to ensure that the integrity of the optical signal path is maintained. In most cases, these opto-electronic modules are built as individual units and, as a result, the need to perform active optical alignment on a unit-by-unit basis becomes expensive and time-consuming.

Indeed, as the demand for opto-electronic modules continues to increase, the individual unit assembly approach has become problematic. Wafer level packaging is considered to be a more efficient and cost-effective approach, with one exemplary arrangement of wafer level packaging disclosed in our co-pending application Ser. No. 13/463,408, filed May 3, 2012 and herein incorporated by reference.

In our co-pending application, a silicon wafer is utilized as a "platform" (i.e. interposer) upon which all of the components for a multiple number of opto-electronic modules are mounted or integrated, with the top surface of the silicon interposer used as a reference plane for defining the optical signal path between separate optical components. The use of a single silicon wafer as a platform for a large number of separate modules allows for a wafer level assembly process to efficiently assemble a large number of modules in a relatively short period of time. Some prior art arrangements describe the use of a glass interposer in place of a silicon wafer interposer, while retaining the ability to assembly multiple opto-electronic modules at the same time. See, for example, US Patent Publication 2012/0106117 authored by V. V. Sundaram and published on May 3, 2012, which discloses a three-dimensional interconnect structure based upon a glass interposer.

In most cases, a "lid" needs to be placed over and attached to the populated interposer component. In one exemplary prior art arrangement, a lid is formed as two separate piece parts, a "sidewall" portion that attaches to the interposer top surface and a flat "top" portion that is bonded to the sidewall portion. The height of the sidewall is generally defined by the space required for the components disposed on the interposer, as well as a layer of adhesive material used to bond the sidewall to the interposer. In other cases, the sidewall is defined by a combination of a "rim" formed on the interposer and a "rim" formed on the lid, where the two rims are later joined to form the sidewall. Heretofore, the manufacture of lids provided with rims was considered to be expensive and required mechanical machining of a glass plate. This subtractive technique is expensive and ill-suited to a wafer level assembly process.

BRIEF DESCRIPTION OF THE DRAWINGS

The accompanying drawings, which are incorporated in and constitute a part of this disclosure, illustrate various embodiments of the present invention. In the drawings.

DESCRIPTION OF EXAMPLE EMBODIMENTS

Overview

Figure 1:
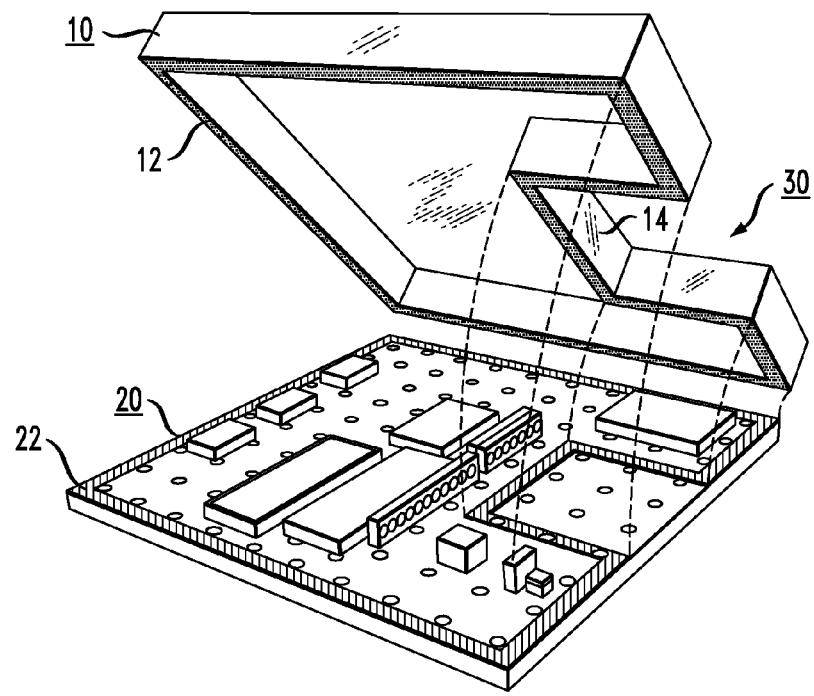
FIG. 1 is an isometric view of an opto-electronic module assembly, illustrating a molded glass lid that may be used to encapsulate the assembly in accordance with the present invention.

An opto-electronic assembly is provided comprising a substrate (generally of silicon or glass) for supporting a plurality of interconnected optical and electrical components. A layer of sealing material is disposed to outline a defined peripheral area of the substrate. A molded glass lid is disposed over and bonded to the substrate, where the molded glass lid is configured to create a footprint that matches the defined peripheral area of the substrate. The bottom surface of the molded glass lid includes a layer of bonding material that contacts the substrate's layer of sealing material upon contact, creating a bonded assembly. In one form, a wafer level assembly process is proposed where multiple opto-electronic assemblies are disposed on a silicon (or glass) wafer and multiple glass lids are molded in a single sheet of glass that is thereafter bonded to the silicon wafer.

Example Embodiments

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

FIG. 1 is an isometric view of an opto-electronic module assembly, illustrating a molded glass lid 10 that may be used to encapsulate the assembly in accordance with the present invention. In this case, the opto-electronic module includes a number of optical and electronic components that have been disposed to populate an interposer (carrier) substrate 20, where interposer 20 may comprise a silicon or glass material. Various well-known methods may be used for affixing the optical and electrical components in place in their respective openings/locations on interposer 20. In particular, epoxy, eutectic bonding or other arrangements may be used to permanently attach the components to their respective locations. It is to be understood that an appropriate temperature hierarchy may need to be established such that the stability of the joints are ensured during other potentially high temperature post-processing operations.

A sealing layer 22 is shown as being formed around the perimeter of interposer 20. This sealing layer, which may comprise a glass frit material, a AuSn solder, or any other suitable material, is used to bond molded glass lid 10 to populated interposer 20. As shown in FIG. 1, molded glass lid 10 is configured to follow the periphery of interposer 20 as guided by the pattern of sealing layer 22. Additionally, bottom surface 12 of lid 10 is coated with one or more specific materials to bond with sealing layer 22 and form an impermeable encapsulation of the opto-electronic module. In one embodiment, surface 12 may be coated with a multi-layer arrangement of titanium, copper and gold.

Figure 2:
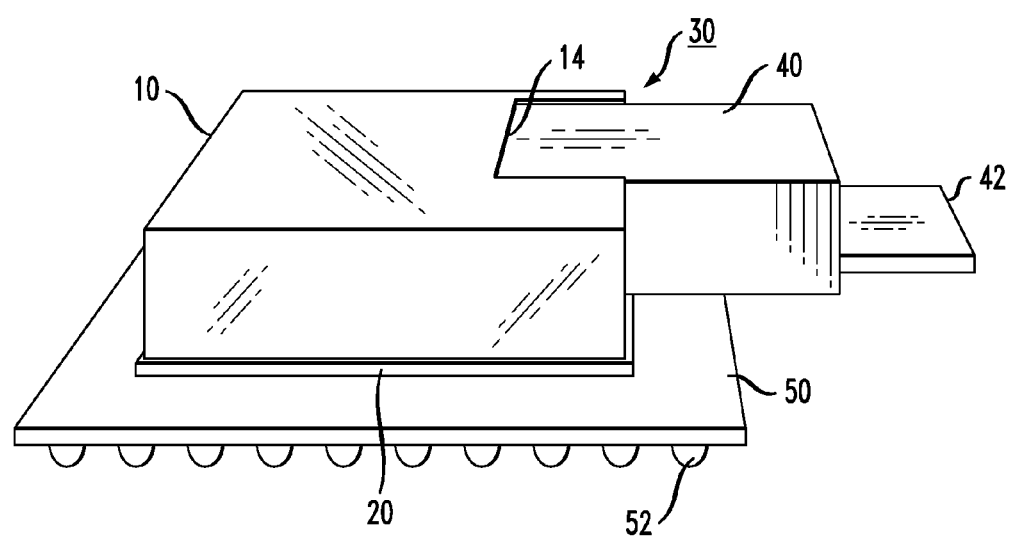
FIG. 2 is a view of the arrangement of FIG. 1 with the molded glass lid fitted in place over the opto-electronic module.

In the particular embodiment as shown in FIG. 1, molded glass lid 10 is specifically configured to also include an opening 30, which allows for optical input and output signals to access the encapsulated opto-electronic module. As shown in FIG. 2, for example, opening 30 is used to allow for an optical connector 40 to be inserted. In this case, sidewall 14 of glass lid 10 may require additional processing (such as polishing and/or etching) to create an "optical grade" surface as required for transmission of an optical signal through this barrier for reception by optical components disposed on interposer 20. At times, this sidewall 14 of glass lid 10 is referred to as an "optical window".

FIG. 2 is a view of the arrangement of FIG. 1 with the molded glass lid fitted in place over the opto-electronic module. Interposer 20 itself is shown as disposed on a circuit substrate 50 (sometimes referred to as an "organic substrate"), with an electrical interconnect 52 in the form of a ball grid array (BGA) disposed underneath substrate 50 and utilized to provide contact to electrical signals and power supplies (not shown). Also shown in FIG. 2 is optical connector 40, disposed in opening 30 of lid 10 and positioned upon the top surface of interposer 20. In this particular embodiment, a fiber array component 42 is attached to optical connector 40 and used to support the transmission of optical signals.

Figure 3:
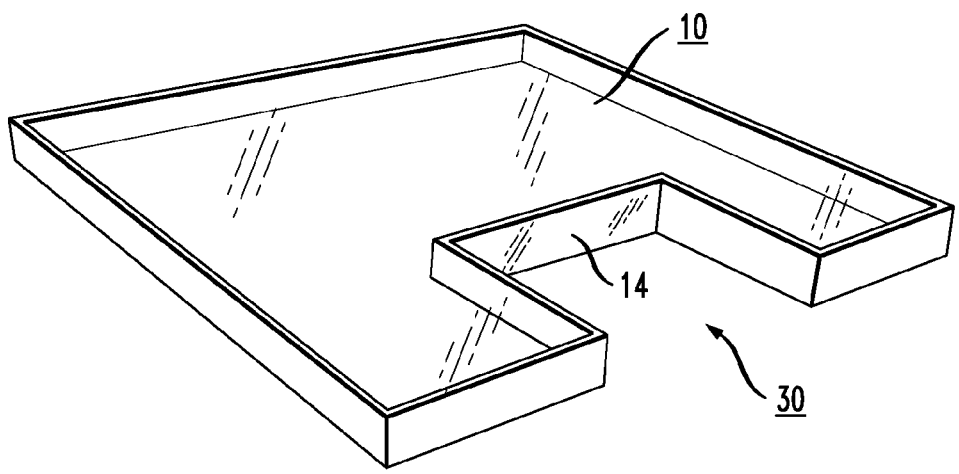
FIG. 3 is an isometric view of an exemplary molded glass lid formed in accordance with the present invention.

In order for optical signals to be transmitted from the optical components on interposer 20 to optical connector 40, it is preferable that sidewall portion 14 of molded glass lid 10 be optically smooth and limit scattering and other types of optical signal loss (referred to, at times, as an "optical grade" surface). FIG. 3 is an isometric view of an exemplary molded glass lid formed in accordance with the present invention. Here, FIG. 3 shows the location of optical grade sidewall section 14. As will be discussed below, molded glass lid 10 may be formed of any suitable glass material that exhibits a low melting temperature, allowing for the glass to be "softened" and molded. Borosilicate glass is one exemplary type of glass that may be used to form a molded glass lid in accordance with the present invention. Sidewall optical window portion 14 may then be processed (e.g. polished and/or etched) subsequent to the molding process in order to create an optical grade surface.

Figure 4:
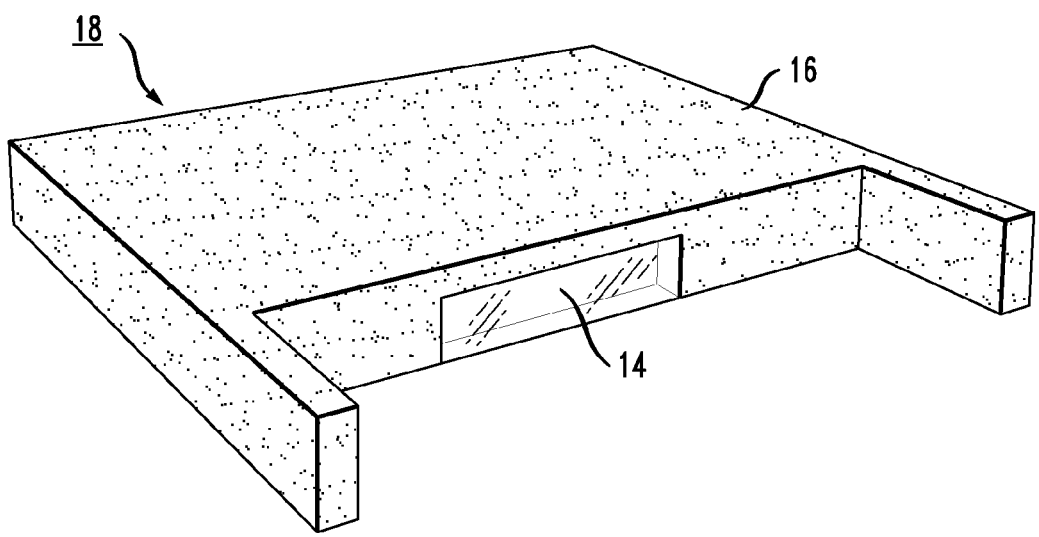
FIG. 4 is a view of the lid of FIG. 3, in this case coated with an anti-reflective material.

In most cases, it is desirable to control the ingress/egress of optical signals between the components encapsulated within lid 10 and various external components. Referring to FIG. 2, the permitted optical signal path(s) is(are) along optical connector 40. In some embodiments, outer surface 16 of molded glass lid 10 is coated with an anti-reflective (AR) material to prevent stray optical signals from interfering with the operation of the opto-electronic module. Magnesium fluoride is one well-known AR coating material that may be used for this purpose. FIG. 4 is a view of the lid of FIG. 3, in this case coated with an anti-reflective material. In particular, FIG. 4 illustrates molded glass lid 10, as shown in FIG. 3, but in this case also including an AR coating 18 which is applied to cover outer surface 16 of molded glass lid 10, except for sidewall portion 14—the region defined as the optical window.

As mentioned above, a significant improvement in fabrication efficiency, without sacrificing the integrity of the necessary precise optical alignments between various individual elements, is provided by utilizing a wafer level assembly technique, employing a silicon or glass wafer as a carrier substrate (also referred to herein as an interposer) upon which a plurality of opto-electronic modules are formed at the same time. Since a typical wafer has a diameter on the order of eight inches, this wafer can support the creation of multiple modules (e.g., tens of die across the wafer surface. In accordance with the present invention, a similar benefit is derived by utilizing a wafer-sized glass substrate to form multiple lids that are bonded to the multiple modules formed on the interposer wafer in a single fabrication step. Indeed, by utilizing a low-temperature glass material that is capable of being molded, a glass substrate can be inexpensively processed to form lids for these opto-electronic modules.

Figure 5:
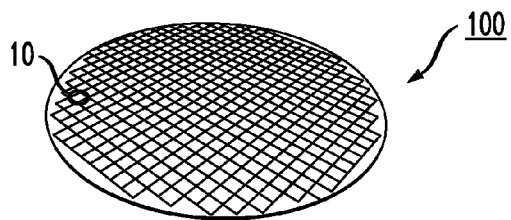
FIG. 5 shows an exemplary glass substrate that may be used in wafer level processing to simultaneously create a multiple number of molded glass lids.
Figure 6:
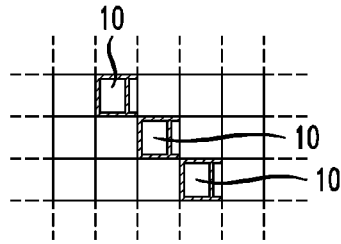
FIG. 6 is an enlarged view of a portion of the substrate of FIG. 5, illustrating the formation of molded features within each separate die location.

FIG. 5 shows an exemplary glass substrate that may be used in wafer level processing to simultaneously create a multiple number of molded glass lids. A glass substrate 100 is shown in FIG. 5 that may be utilized as a structure to simultaneously form a multiple number of molded glass lids 10 for a like number of opto-electronic modules 20. As shown, a large number of individual lid locations 10 are defined on wafer 100. FIG. 6 is an enlarged view of a portion of the substrate of FIG. 5, illustrating the formation of molded features within each separate die location. For the purposes of clarity, only three such locations 10 are particularly illustrated as having the molded lid form.

Figure 7:
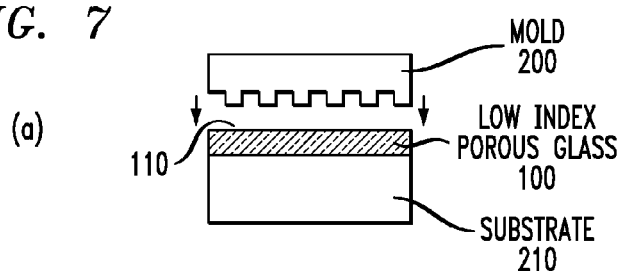
FIGS. 7($a$)-($c$) illustrate an exemplary set of steps for forming a molded glass substrate to contain multiple glass lids in accordance with the present invention.
Figure 7:
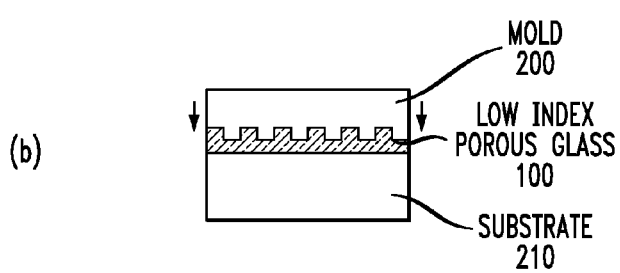
Figure 7:
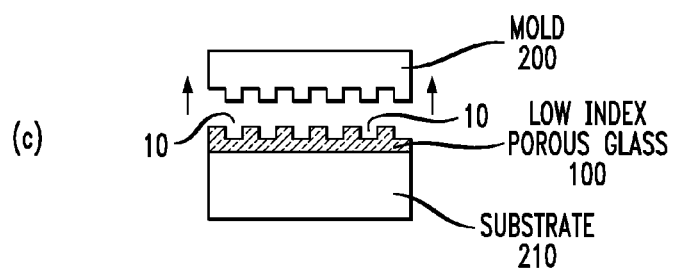

In a preferred embodiment of the present invention, a micromolding process is used to soften and mold glass substrate 100 to include the various cavities and openings required for the specific lid configuration. FIGS. 7(a)-(c) illustrate an exemplary set of steps for forming a molded glass substrate to contain multiple glass lids in accordance with the present invention. A mold 200 is first formed to include the various indentations needed to define the shape of a specific lid geometry, such as lid 10. Equipment such as a diamond turn machine (not shown) is known as capable of forming mold indentations with the necessary degree of precision. Referring to FIG. 7(a), glass substrate 100 is positioned on a holding platform, or support member 210 and heated to a temperature where the glass begins to soften. In the case of borosilicate glass, this is a temperature of about 450° C. Once the glass has become malleable, mold 200 is brought into contact with top surface 110 of glass substrate 100 with a force sufficient to re-shape the glass and create the desired cavities for the molded lids, as shown in FIG. 7(b). Once formed, mold 200 is raised as shown in FIG. 7(c), having created a plurality of molded lids 10. The final molded glass substrate 100 is cooled so that it may be bonded to a wafer containing the opto-electronic modules as described above.

Once molded glass substrate 100 is joined to the component wafer, the bonded structure is diced to form the final, individual opto-electronic modules. A laser dicing process is preferred, but it is to be understood that any other suitable process for separating the bonded wafers into separate transceiver modules may also be used.

While the invention has been described in terms of different embodiments, those skilled in the art will recognize that the invention can be practiced with various modifications that are considered to fall within the spirit and scope of the invention as best defined by the claims appended hereto. Furthermore, while the specification has been described in language specific to structural features and/or methodological acts, the claims are not limited to the features or acts described above. Rather, the specific features and acts described above are disclosed as examples for embodiments of the invention.

What is claimed is:

1. A method, comprising:
   heating a substrate comprising glass material to a temperature to create a softened substrate, wherein the softened substrate includes a first side and a second side opposite the first side;
   pressing the softened substrate with a mold at the first side of the softened substrate and a support member at the second side of the softened substrate to create at least one sidewall and an indentation formed by an inner surface of the at last one sidewall within the softened substrate, wherein an outer surface of the at least one sidewall is opposite and parallel to the inner surface, the indentation defining a predetermined lid configuration, and the indentation configured to receive an opto-electronic component disposed on an interposer substrate;
   removing the mold from the softened substrate; and
   cooling the softened substrate to a hardened state to form a molded lid including the indentation,
   wherein an optical region includes the inner surface and the outer surface which are configured to optically couple an optical device disposed outside the indentation with the opto-electronic component received within the indentation.

2. The method of claim 1, wherein the substrate comprises a low melting temperature glass.

3. The method of claim 1, wherein the substrate comprises borosilicate glass.

4. The method of claim 1,
   wherein the heating the substrate includes the substrate having a wafer-sized body,
   wherein the pressing the softened substrate with the mold is performed as a wafer level process creating the indentation including a plurality of indentations defining the predetermined lid configuration for the molded lid including a plurality of separate molded lids.

5. The method of claim 4, wherein the-opto-electronic component includes a plurality of opto-electronic components, the method further comprising:
   bonding the substrate to the interposer substrate to create a bonded arrangement in which the plurality of opto-electronic components are received within the plurality of indentations; and
   dicing the bonded arrangement to form a plurality of opto-electronic assemblies.

6. The method of claim 5, further comprising coating the substrate with an anti-reflective material prior to bonding the substrate to the interposer substrate.

7. The method of claim 1, further comprising performing a surface finishing operation to create the optical region of the at least one sidewall.

8. The method of claim 7, wherein the performing the surface finishing operation includes polishing the at least one sidewall.

9. The method of claim 1, wherein the pressing the softened substrate with the mold comprises disposing the at least one sidewall in the predetermined lid configuration, wherein the at least one sidewall at least partially surrounds the optical device disposed outside of the indentation when the optical device is optically coupled to the at least one optoelectronic module received within the molded lid.

10. The method of claim 1, wherein the optical device comprises an optical connector.

11. The method of claim 1, wherein the pressing the softened substrate comprises contacting, with the mold, opposite surfaces of the optical region, and the optical region is configured to optically couple the optical device and the opto-electronic component through the opposite surfaces.

12. The method of claim 1, further comprising coating a bottom surface of the at least one sidewall of the molded lid with a bonding material.

13. The method of claim 12, wherein the coating the bottom surface comprises depositing layers of titanium, copper and gold upon the bottom surface.

\* \* \* \* \*